United States Patent
Dai

(10) Patent No.: US 9,461,627 B2
(45) Date of Patent: Oct. 4, 2016

(54) GATE-DRIVE-ON-ARRAY CIRCUIT FOR USE WITH OXIDE SEMICONDUCTOR THIN-FILM TRANSISTORS

(71) Applicant: Shenzhen China Star Optoelectronics Technology Co., Ltd., Shenzhen, Guangdong (CN)

(72) Inventor: Chao Dai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 86 days.

(21) Appl. No.: 14/424,147

(22) PCT Filed: Nov. 5, 2014

(86) PCT No.: PCT/CN2014/090286
§ 371 (c)(1),
(2) Date: Feb. 26, 2015

(87) PCT Pub. No.: WO2016/061851
PCT Pub. Date: Apr. 28, 2016

(65) Prior Publication Data
US 2016/0248402 A1 Aug. 25, 2016

(30) Foreign Application Priority Data
Oct. 22, 2014 (CN) .......................... 2014 1 0568872

(51) Int. Cl.
*H03K 17/10* (2006.01)
*H03K 3/012* (2006.01)
*H01L 29/786* (2006.01)
*G09G 3/36* (2006.01)

(52) U.S. Cl.
CPC ............ *H03K 3/012* (2013.01); *G09G 3/3677* (2013.01); *G09G 3/3696* (2013.01); *H01L 29/7869* (2013.01); *G09G 2300/0809* (2013.01); *G09G 2300/0842* (2013.01)

(58) Field of Classification Search
CPC ...................................................... H03K 17/10
See application file for complete search history.

(56) References Cited

U.S. PATENT DOCUMENTS 9,311,880 B2 * 4/2016 Dai ...................... G09G 3/3648
9,390,674 B2 * 7/2016 Xiao .................... G09G 3/3696

* cited by examiner

*Primary Examiner* — Hai L Nguyen
(74) *Attorney, Agent, or Firm* — Andrew C. Cheng

(57) ABSTRACT

A gate-drive-on-array circuit for use with oxide semiconductor thin-film transistors of the present invention uses two constant-voltage negative potential sources (VSS1, VSS2) that are reduced step by step and low potentials of a high-frequency clock signal (CK(n)) and a low-frequency clock signal (LC1, LC2) to ensure an up-pull circuit portion (200) is maintained in a well closed condition during a non-operating period without being affected by the high-frequency clock signal (CK(n)) so as to ensure the circuit operates normally. Further, the first down-pull circuit portion (400) is re-designed to prevent influence thereof imposed on the outputs of the first node (Q(N)) and the output terminal (G(N)) so as to ensure the first node (Q(N)) and the output terminal (G(N)) can supply the outputs normally without generating signal distortion.

11 Claims, 11 Drawing Sheets

US 9,461,627 B2

GATE-DRIVE-ON-ARRAY CIRCUIT FOR USE WITH OXIDE SEMICONDUCTOR THIN-FILM TRANSISTORS

BACKGROUND OF THE INVENTION

1. Field of the Invention

The present invention relates to the field of liquid crystal displaying technology, and in particular to a gate-drive-on-array (GOA) circuit for use with oxide semiconductor thin-film transistors.

2. The Related Arts

GOA (Gate Drive on Array) refers to forming a gate column-scanning drive signal circuit on a thin-film transistor (TFT) array substrate with an array process of a TFT liquid crystal display in order to achieve a column-by-column scanning gate driving method.

For conventional amorphous silicon semiconductor devices, since the threshold voltage Vth of the electrical characteristics of an amorphous silicon TFT is, in general, greater than 0V and the voltage swing with respect to current in a sub-threshold area is relatively large. In a circuit with such a design, even though some transistors are operating in a condition that the voltage Vgs between the gate and the source of the transistor is around 0V, the leakage current is relatively small. However, for oxide semiconductor thin-film transistors that are currently under development, due to the material property of such semiconductor materials being different from those of amorphous silicon, the threshold voltage Vth of such thin-film transistors may sometime becomes less than 0V and the voltage swing with respect to current in the sub-threshold area is relatively small. This leads to a relatively great leakage current for some important transistors included in a circuit when they are operating around Vgs=0V. Thus, a particular design solution must be adopted for a gate-drive-on-array circuit of oxide semiconductor thin-film transistors, in order to prevent some important thin-film transistors from operating around Vgs being equal to 0V.

As shown in FIG. 1, which is a conventional gate-drive-on-array circuit for use with amorphous silicon thin-film transistors, the primary architecture of the circuit comprises: a up-pull control portion 100, a up-pull portion 200, a down-transfer portion 300, a first down-pull portion 400, a bootstrap capacitor 500, and a down-pull holding portion 600.

Control signal sources of the gate-drive-on-array circuit for use with amorphous silicon thin-film transistors generally include a high-frequency clock signal CK(n), a constant-voltage low potential source VSS, and low-frequency clock signals LC1 and LC2, wherein LC1 and LC2 are low-frequency signal sources having opposite phases. In setting a general CK(n), the low potentials of LC1 and LC2 would be less than VSS, but the key nodes Q(N) and G(N) of the circuit will both be pulled down to VSS during a non-operating period. As such, for a twenty-first transistor T21 of the up-pull portion 200 and a twenty-second transistor T22 of the down-transfer portion 300, the essential operation voltage VgsP≈0V, and Q(N) is susceptible to fluctuations between highs and lows. In other words, the situation that Vgs>0V might exist. Then, when the circuit is applied directly to the design of a drive circuit for oxide semiconductor thin-film transistors, there will be a relatively large leakage current, making it not possible to ensure the output terminal G(N) maintains at a low potential during a non-operating period. This would lead to poor output of the output terminal G(N) and poor performance of the GOA circuit.

Similarly, the same issues are equally applicable to a thirty-first transistor T31 and the forty-first transistor T41 of the first down-pull portion 400. During an operating period when Q(N) and G(N) are of high potentials, the leakage currents of T31 and T41 would cause distortion of the output waveform of Q(N) and G(N) thereby leading the poor functionality of the GOA circuit in a severe condition (such as operation in high temperatures).

For the down-pull holding circuit portion 600, since the circuit design uses the low potential of LC1 or LC2 to control down pulling of P(N) or K(N) in an operating period, this ensures the low potentials of P(N) and K(N) less than VSS during an operating period and ensuring Vgs<0V for the thirty-second, thirty-third, forty-second, and forty-third transistors T32, T33, T42, T43 in a well closed condition thereby reducing the influence of the down-pull holding circuit portion 600 on the output waveforms of Q(N) and G(N). However, in the design solution that is currently adopted, a bridge TFT T55 of the down-pull holding circuit portion shows Vgs>0V in a non-operating period. This makes the high potential of P(N) or K(N) not raised very high during a non-operating period, thereby affecting the down-pulling effect of T32, T33, T42, and T43 on Q(N) and G(N). This issue, although being improvable through adjusting device size in making a design, causes another problem of increasing leakage current due to the increase of the size.

SUMMARY OF THE INVENTION

An object of the present invention is to provide a gate-drive-on-array (GOA) circuit for oxide semiconductor thin-film transistors, which is an improvement made on a conventional amorphous silicon GOA circuit, in order to make the circuit applicable to an oxide semiconductor GOA circuit for overcoming poor circuit functioning caused by the property differences between the oxide semiconductor and amorphous silicon.

In respect of the above object, the present invention provides a gate-drive-on-array circuit for use with oxide semiconductor thin-film transistors, which comprises multiple stages of cascaded GOA units, wherein, with N being a positive integer, the Nth-stage GOA unit comprises an up-pull control portion, an up-pull portion, a down-transfer portion, a first down-pull portion, a bootstrap capacitor portion, and a down-pull holding circuit portion;

the up-pull control portion comprising an eleventh transistor, where the eleventh transistor has a gate terminal electrically connected with a drive signal terminal of a second-anterior-stage GOA unit of the Nth-stage GOA unit, the (N−2)th-stage GOA unit, a source terminal electrically connected with an output terminal of the second-anterior-stage GOA unit of the Nth-stage GOA unit, the (N−2)th-stage GOA unit, and a drain terminal electrically connected with a first node;

the up-pull portion comprising a twenty-first transistor, where the twenty-first transistor has a gate terminal electrically connected with the first node, a source terminal electrically connected with a high-frequency clock signal, and a drain terminal electrically connected with an output terminal;

the down-transfer portion comprising a twenty-second transistor, where the twenty-second transistor has a gate terminal electrically connected with the first node, a source terminal electrically connected with the high-frequency clock signal, and a drain terminal electrically connected with a drive output terminal;

the first down-pull portion comprising a forty-first transistor, where the forty-first transistor has a gate terminal electrically connected with an output terminal of a third-posterior-stage GOA unit of the Nth-stage GOA unit, the (N+3)th-stage GOA unit, a drain terminal electrically connected with the first node, and a source terminal electrically connected with the output terminal;

the bootstrap capacitor portion comprising a capacitor, where the capacitor has an end electrically connected with the first node and an opposite end electrically connected with the output terminal;

the down-pull holding portion comprising: a forty-second transistor, where the forty-second transistor has a gate terminal electrically connected with a second node, a source terminal electrically connected with the first node, and a drain terminal electrically connected with a second constant-voltage negative potential source;

a thirty-second transistor, where the thirty-second transistor has a gate terminal electrically connected with the second node, a source terminal electrically connected with the output terminal, and a drain terminal electrically connected with a first constant-voltage negative potential source;

a fifty-first transistor, where the fifty-first transistor has a gate terminal and a source terminal both of which are electrically connected with a first low-frequency signal source and a drain terminal electrically connected with a fourth node;

a fifty-second transistor, where the fifty-second transistor has a gate terminal electrically connected with the first node, a source terminal electrically connected with the fourth node, and a drain terminal electrically connected with the first constant-voltage negative potential source;

a fifty-third transistor, where the fifty-third transistor has a gate terminal electrically connected with the fourth node, a source terminal electrically connected with the first low-frequency signal source, and a drain terminal electrically connected with the second node;

a fifty-fourth transistor, where the fifty-fourth transistor has a gate terminal electrically connected with a second low-frequency signal source, a source terminal electrically connected with the first low-frequency signal source, and a drain terminal electrically connected with the second node;

a fifty-fifth transistor, where the fifty-fifth transistor has a gate terminal electrically connected with the first node, a source terminal electrically connected with the second node, and a drain terminal electrically connected with a third node;

a sixty-fourth transistor, where the sixty-fourth transistor has a gate terminal electrically connected with the first low-frequency signal source, a source terminal electrically connected with the second low-frequency signal source, and a drain terminal electrically connected with the third node;

a sixty-third transistor, where the sixty-third transistor has a gate terminal electrically connected with a fifth node, a source terminal electrically connected with the second low-frequency signal source, and a drain terminal electrically connected with the third node;

a sixty-second transistor, where the sixty-second transistor has a gate terminal electrically connected with the first node, a source terminal electrically connected with the fifth node, and a drain terminal electrically connected with the first constant-voltage negative potential source;

a sixty-first transistor, where the sixty-first transistor has a gate terminal and a source terminal both of which are electrically connected with the second low-frequency signal source and a drain terminal electrically connected with the fifth node;

a thirty-third transistor, where the thirty-third transistor has a gate terminal electrically connected with the third node, a source terminal electrically connected with the output terminal, and a drain terminal electrically connected with the first constant-voltage negative potential source; and a forty-third transistor, where the forty-third transistor has a gate terminal electrically connected with the third node, a source terminal electrically connected with the first node, and a drain terminal electrically connected with the second constant-voltage negative potential source; and the first constant-voltage negative potential source being higher than the second constant-voltage negative potential source.

In the first-stage GOA unit of the gate-drive-on-array circuit, the gate terminal of the eleventh transistor is electrically connected with a start signal terminal and the source terminal is electrically connected with the start signal terminal.

In the second-stage GOA unit of the gate-drive-on-array circuit, the gate terminal and the source terminal of the eleventh transistor are both electrically connected with the start signal terminal of the circuit.

In the third last stage, the second last stage, and the last stage GOA units of the gate-drive-on-array circuit, the gate terminal of the forty-first transistor is electrically connected with the start signal terminal.

The source terminal of the forty-first transistor of the first down-pull portion is electrically connected with the second constant-voltage negative potential source.

The gate terminal of the fifty-fifth transistor of the down-pull holding portion is electrically connected with the drive output terminal. The down-pull holding portion further comprises a fifty-seventh transistor, where the fifty-seventh transistor has a gate terminal electrically connected with a drive output terminal of a second-anterior-stage GOA unit of the Nth-stage GOA unit, the (N−2)th-stage GOA unit, a source terminal electrically connected with the second node, and a drain terminal electrically connected with the third node.

The down-pull holding portion further comprises a seventy-second transistor, where the seventy-second transistor has a gate terminal electrically connected with the second node, a source terminal electrically connected with the drive output terminal, and a drain terminal electrically connected with the second constant-voltage negative potential source; and a seventy-third transistor, where the seventy-third transistor has a gate terminal electrically connected with the third node, a source terminal electrically connected with the drive output terminal, and a drain terminal electrically connected with the second constant-voltage negative potential source.

The first low-frequency signal source and the second low-frequency signal source are two low-frequency clock signal sources having opposite phases.

Low potentials of the high-frequency clock signal, the first low-frequency signal source, and the second low-frequency signal source are less than the second constant-voltage negative potential source.

The gate-drive-on-array circuit for use with oxide semiconductor thin-film transistors is a gate-drive-on-array circuit for indium gallium zinc oxide (IGZO) thin-film transistors.

The efficacy of the present invention is that the present invention provides a gate-drive-on-array circuit for use with oxide semiconductor thin-film transistors, which uses two constant-voltage negative potential sources that are reduced step by step and low potentials of a high-frequency clock signal and a low-frequency clock signal to ensure an up-pull circuit portion is maintained in a well closed condition during a non-operating period without being affected by the high-frequency clock signal so as to ensure the circuit operates normally. Further, the first down-pull circuit portion is re-designed to prevent influence thereof imposed on the outputs of the first node and the output terminal during an operating period so as to ensure the first node and the output terminal can supply the outputs normally without generating signal distortion.

BRIEF DESCRIPTION OF THE DRAWINGS

For better understanding of the features and technical contents of the present invention, reference will be made to the following detailed description and the attached drawings of the present invention. However, these drawings are provided only for reference and illustration and are not intended to impose undue limitations to the scope of the present invention. In the drawing:

FIG. 5 is a circuit diagram of a last-stage GOA unit of the first embodiment of the present invention;

DETAILED DESCRIPTION OF THE PREFERRED EMBODIMENTS

Figure 1:
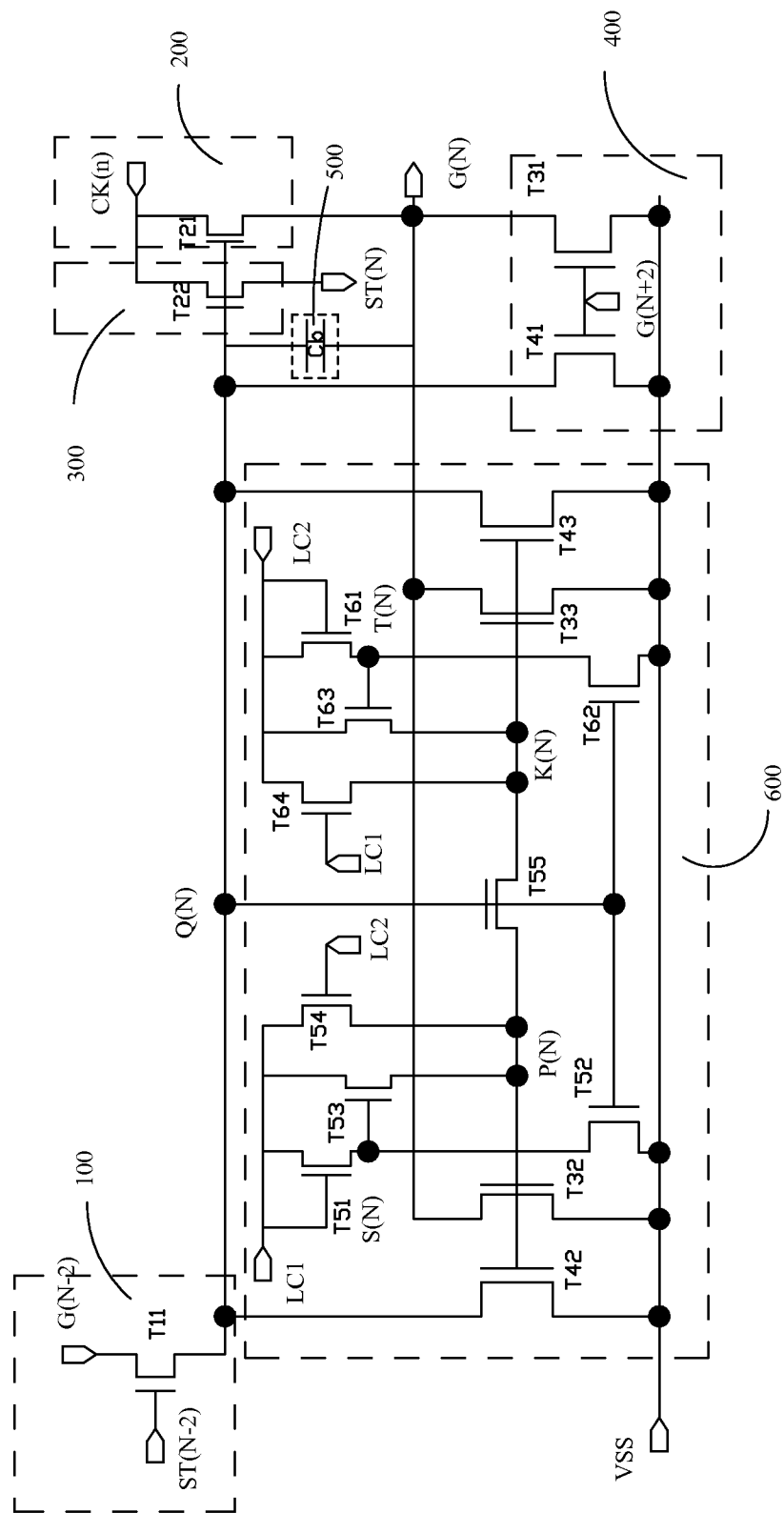
FIG. 1 is a conventional gate-drive-on-array (GOA) circuit for use with amorphous semiconductor thin-film transistors.

To further expound the technical solution adopted in the present invention and the advantages thereof, a detailed description is given to a preferred embodiment of the present invention and the attached drawings.

Referring collectively to FIGS. 2-7, circuit diagrams of a gate-drive-on-array (GOA) circuit for use with oxide semiconductor thin-film transistors according to a first embodiment of the present invention are shown. The gate-drive-on-array circuit for use with oxide semiconductor thin-film transistors is a gate-drive-on-array circuit for indium gallium zinc oxide (IGZO) thin-film transistors, which comprises multiple stages of cascaded GOA units, wherein, with N being a positive integer, the Nth-stage GOA unit comprises an up-pull control portion 100, an up-pull portion 200, a down-transfer portion 300, a first down-pull portion 400, a bootstrap capacitor portion 500, and a down-pull holding circuit portion 600.

The structure of each of the above-mentioned portions and a specific connection thereof are as follows:

The up-pull control portion 100 comprises an eleventh transistor T11, where the eleventh transistor T11 has a gate terminal electrically connected with a drive signal terminal ST(N−2) of a second-anterior-stage GOA unit of the Nth-stage GOA unit, the (N−2)th-stage GOA unit, a source terminal electrically connected with an output terminal G(N−2) of the second-anterior-stage GOA unit of the Nth-stage GOA unit, the (N−2)th-stage GOA unit, and a drain terminal electrically connected with a first node Q(N).

The up-pull portion 200 comprises a twenty-first transistor T21, where the twenty-first transistor T21 has a gate terminal electrically connected with the first node Q(N), a source terminal electrically connected with a high-frequency clock signal CK(n), and a drain terminal electrically connected with an output terminal G(N).

The down-transfer portion 300 comprises a twenty-second transistor T22, where the twenty-second transistor T22 has a gate terminal electrically connected with the first node Q(N), a source terminal electrically connected with the high-frequency clock signal CK(n), and a drain terminal electrically connected with a drive output terminal ST(N).

The first down-pull portion 400 comprises a forty-first transistor T41, where the forty-first transistor T41 has a gate terminal electrically connected with an output terminal G(N+3) of a third-posterior-stage GOA unit of the Nth-stage GOA unit, the (N+3)th-stage GOA unit, a drain terminal electrically connected with the first node Q(N), and a source terminal electrically connected with the output terminal G(N).

The bootstrap capacitor portion 500 comprises a capacitor Cb, where the capacitor Cb has an end electrically connected with the first node Q(N) and an opposite end electrically connected with the output terminal G(N).

The down-pull holding portion 600 comprises a forty-second transistor T42, where the forty-second transistor T42 has a gate terminal electrically connected with a second node P(N), a source terminal electrically connected with the first node Q(N), and a drain terminal electrically connected with a second constant-voltage negative potential source VSS2; a thirty-second transistor T32, where the thirty-second transistor T32 has a gate terminal electrically connected with the second node P(N), a source terminal electrically connected with the output terminal G(N), and a drain terminal electrically connected with a first constant-voltage negative potential source VSS1; a fifty-first transistor T51, where the fifty-first transistor T51 has a gate terminal and a source terminal both of which are electrically connected with a first low-frequency signal source LC1 and a drain terminal electrically connected with a fourth node S(N); a fifty-second transistor T52, where the fifty-second transistor T52 has a gate terminal electrically connected with the first node Q(N), a source terminal electrically connected with the fourth node S(N), and a drain terminal electrically connected with the first constant-voltage negative potential source VSS1; a fifty-third transistor T53, where the fifty-third transistor T53 has a gate terminal electrically connected with the fourth node S(N), a source terminal electrically connected with the first low-frequency signal source LC1, and a drain terminal electrically connected with the second node P(N); a fifty-fourth transistor T54, where the fifty-fourth transistor T54 has a gate terminal electrically connected with a second low-frequency signal source LC2, a source terminal electrically connected with the first low-frequency signal source LC1, and a drain terminal electrically connected with the second node P(N); a fifty-fifth transistor T55, where the fifty-fifth transistor T55 has a gate terminal electrically connected with the first node Q(N), a source terminal electrically connected with the second node P(N), and a drain terminal electrically connected with a third node K(N); a sixty-fourth transistor T64, where the sixty-fourth transistor T64 has a gate terminal electrically connected with the first low-frequency signal source LC1, a source terminal electrically connected with the second low-frequency signal source LC2, and a drain terminal electrically connected with the third node K(N); a sixty-third transistor T63, where the sixty-third transistor T63 has a gate terminal electrically connected with a fifth node T(N), a source terminal electrically connected with the second low-frequency signal source LC2, and a drain terminal electrically connected with the third node K(N); a sixty-second transistor T62, where the sixty-second transistor T62 has a gate terminal electrically connected with the first node Q(N), a source terminal electrically connected with the fifth node T(N), and a drain terminal electrically connected with the first constant-voltage negative potential source VSS1; a sixty-first transistor T61, where the sixty-first transistor T61 has a gate terminal and a source terminal both of which are electrically connected with the second low-frequency signal source LC2 and a drain terminal electrically connected with the fifth node T(N); a thirty-third transistor T33, where the thirty-third transistor T33 has a gate terminal electrically connected with the third node K(N), a source terminal electrically connected with the output terminal G(N), and a drain terminal electrically connected with the first constant-voltage negative potential source VSS1; a forty-third transistor T43, where the forty-third transistor T43 has a gate terminal electrically connected with the third node K(N), a source terminal electrically connected with the first node Q(N), and a drain terminal electrically connected with the second constant-voltage negative potential source VSS2.

The first constant-voltage negative potential source VSS1 is higher than the second constant-voltage negative potential source VSS2. The first low-frequency signal source LC1 and the second low-frequency signal source LC2 are two low-frequency clock signal sources having exactly opposite phases. The high-frequency clock signal CK(n), the first low-frequency signal source LC1, and the second low-frequency signal source LC2 all have low level potentials that are lower than the second constant-voltage negative potential source VSS2.

It is noted here that to reduce electrical leakage during a non-operating period of the twenty-first transistor T21, the embodiment introduces the second constant-voltage negative potential source VSS2 into the known technique and pull down the potential of the first node Q(N), via the forty-second transistor T42 and the forty-third transistor T43, to the second constant-voltage negative potential source VSS2 and pull down the potential of the output terminal G(N), via the thirty-second transistor T32 and the thirty-third transistor T33, to the first constant-voltage negative potential source VSS1, while VSS1>VSS2, so that it is possible to ensure the voltage between the gate terminal and source terminal of the twenty-first transistor T21, gs<0V, thereby reducing current leakage of the twenty-first transistor T21 during a non-operating period.

Further, the source terminal of the forty-first transistor T41 is connected to the output terminal G(N), so that during an operating period when the output terminal G(N) supplies an output, since the source terminal of the forty-first transistor T41 is of a high potential, the entire leakage current of the forty-first transistor T41 is significantly lowered and an effect of enhancing the potential of the first node Q(N) can be achieved.

Further, to reduce the influence of the first down-pull portion 400 imposed on the output terminal G(N), only one single transistor, the forty-first transistor T41, is provided and the gate terminal of the forty-first transistor T41 is connected to the output terminal G(N+3) of the third-posterior-stage GOA unit of the Nth-stage GOA unit, the (N+3)th-stage GOA unit, in order to ensure the first node Q(N) possess a potential showing a "ridge" form. The twenty-first transistor T21 is used to immediately pull down the output terminal G(N).

Figure 3:
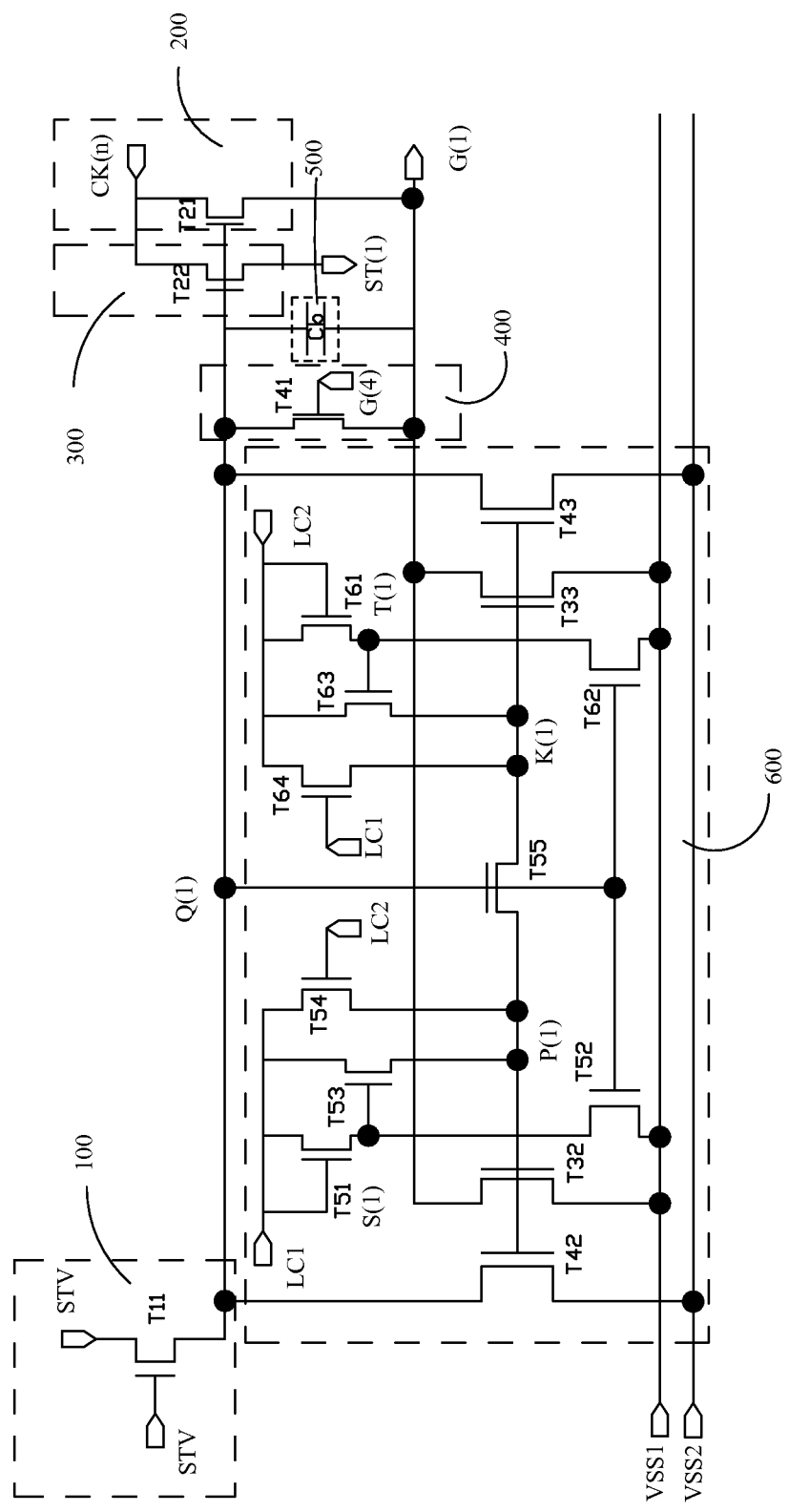
FIG. 3 is a circuit diagram of a first-stage GOA unit of the first embodiment of the present invention.

As shown in FIG. 3, in the first-stage GOA unit of the gate-drive-on-array circuit, the gate terminal of the eleventh transistor T11 is electrically connected with a start signal terminal STV and the source terminal is electrically connected with the start signal terminal STV.

Figure 4:
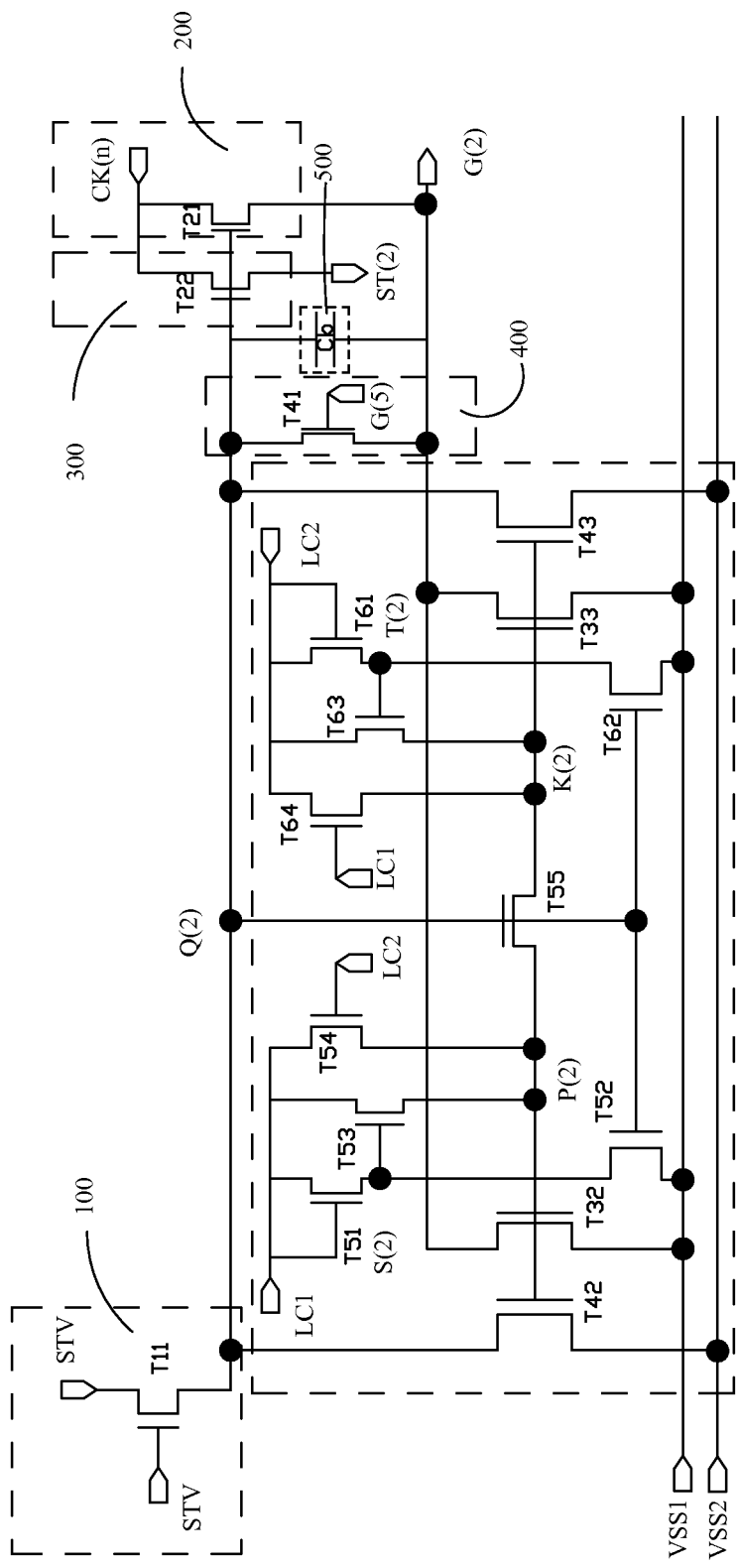
FIG. 4 is a circuit diagram of a second-stage GOA unit of the first embodiment of the present invention.

As shown in FIG. 4, in the second-stage GOA unit of the gate-drive-on-array circuit, the gate terminal and the source terminal of the eleventh transistor T11 are both electrically connected with the start signal terminal STV of the circuit.

Figure 5:
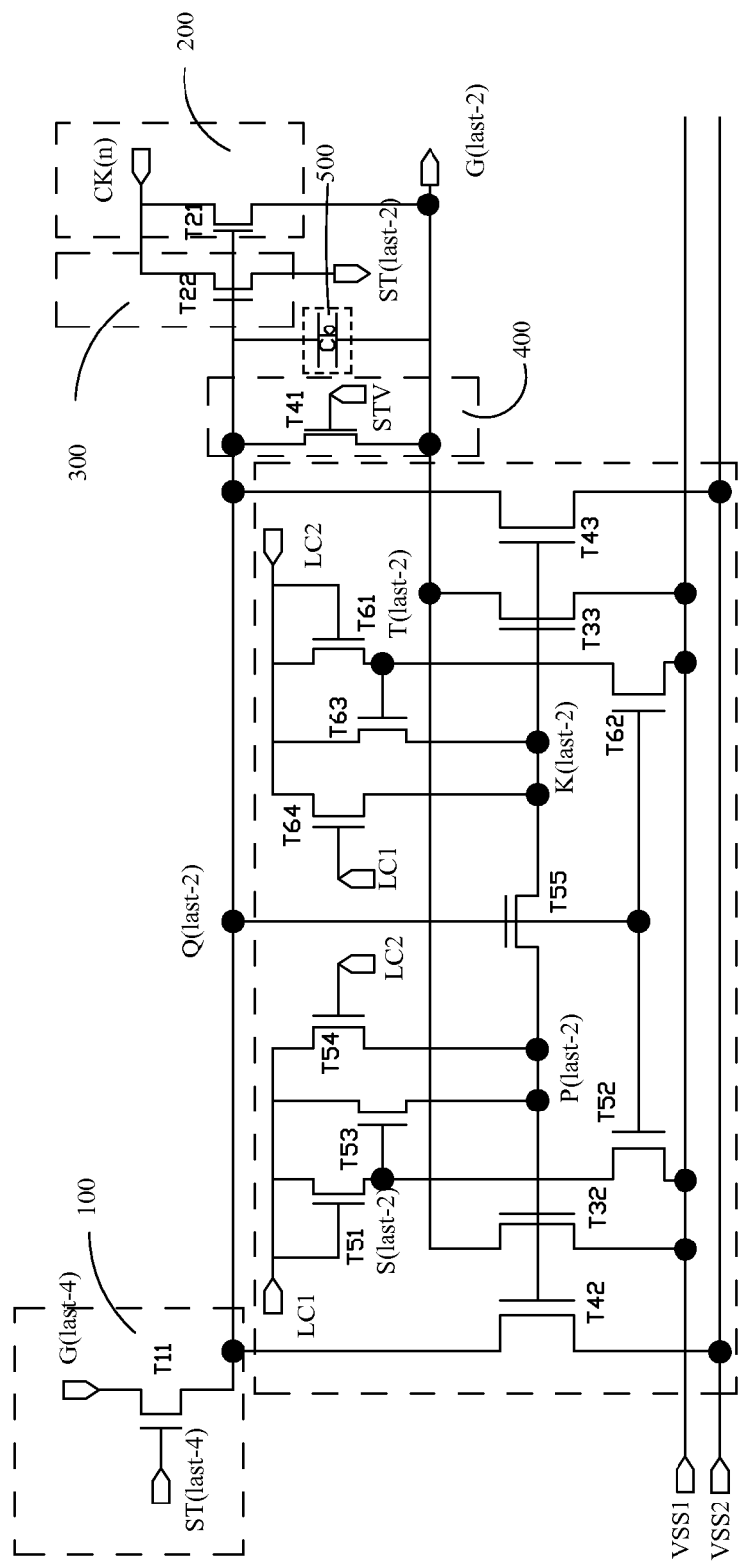
FIG. 5 is a circuit diagram of a third-last-stage GOA unit of the first embodiment of the present invention.
Figure 6:
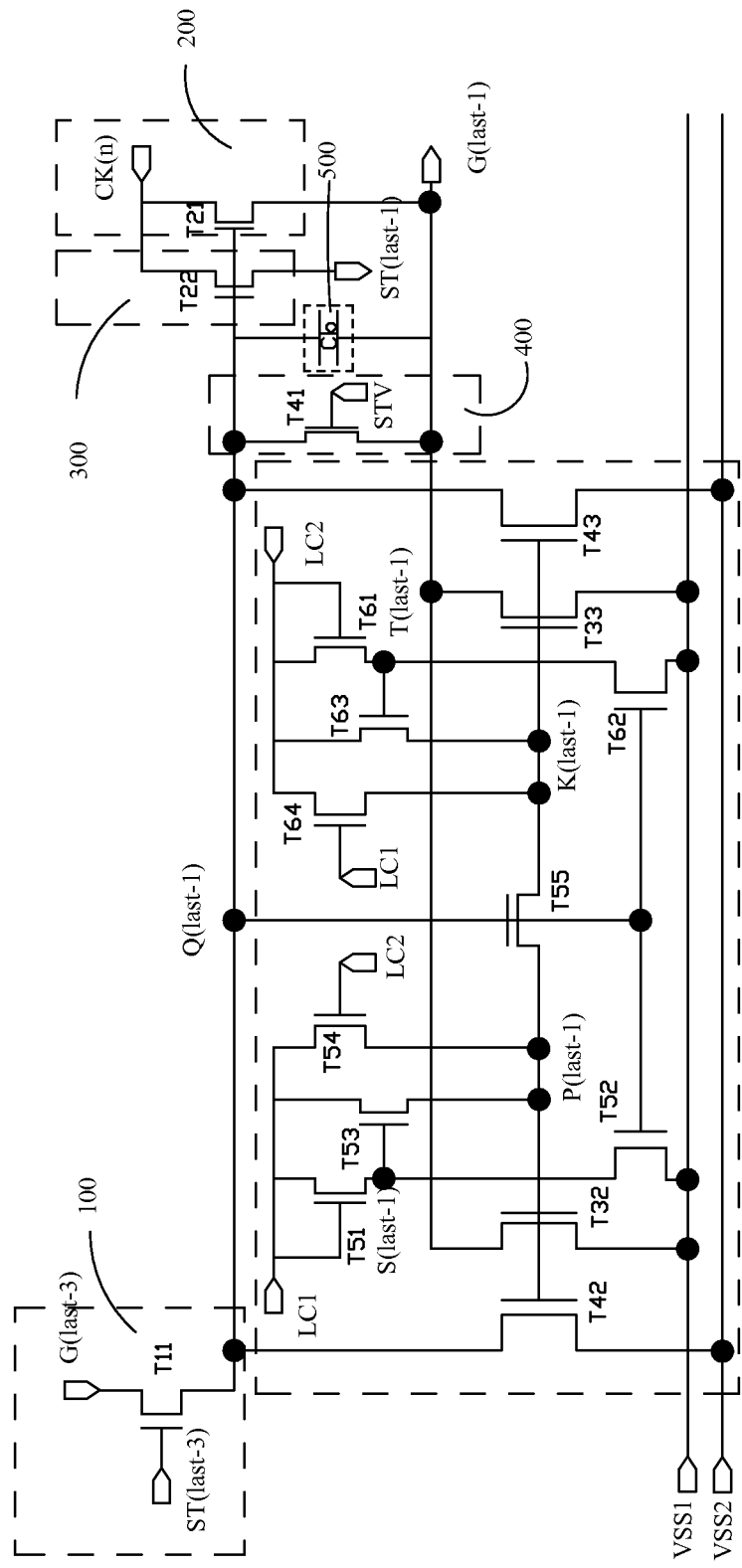
FIG. 6 is a circuit diagram of a second-last-stage GOA unit of the first embodiment of the present invention.
Figure 7:
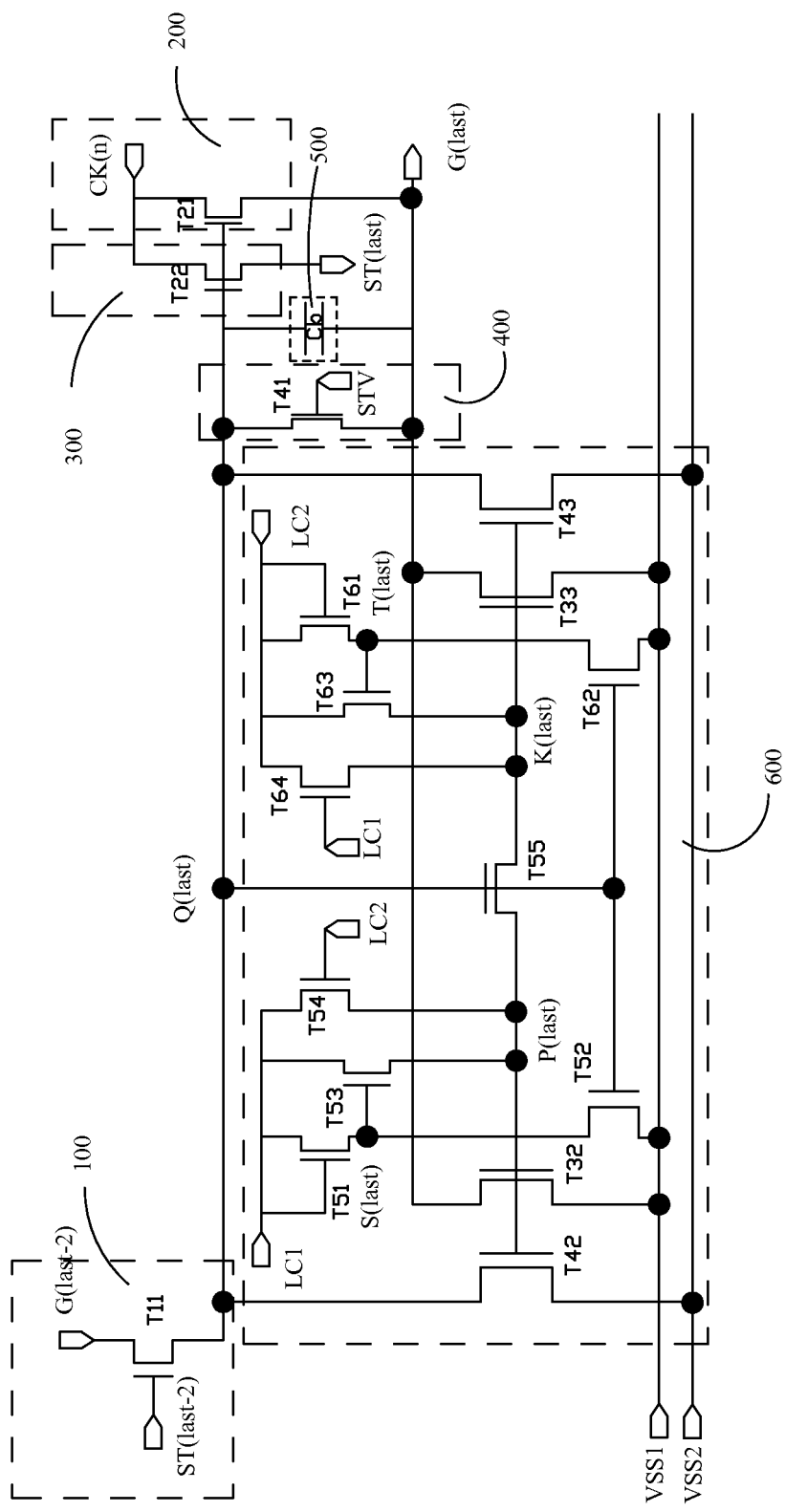

As shown in FIGS. 5, 6, and 7, in the third last stage, the second last stage, and the last stage GOA units of the gate-drive-on-array circuit, the gate terminal of the forty-first transistor T41 is electrically connected with the start signal terminal STV.

Figure 8:
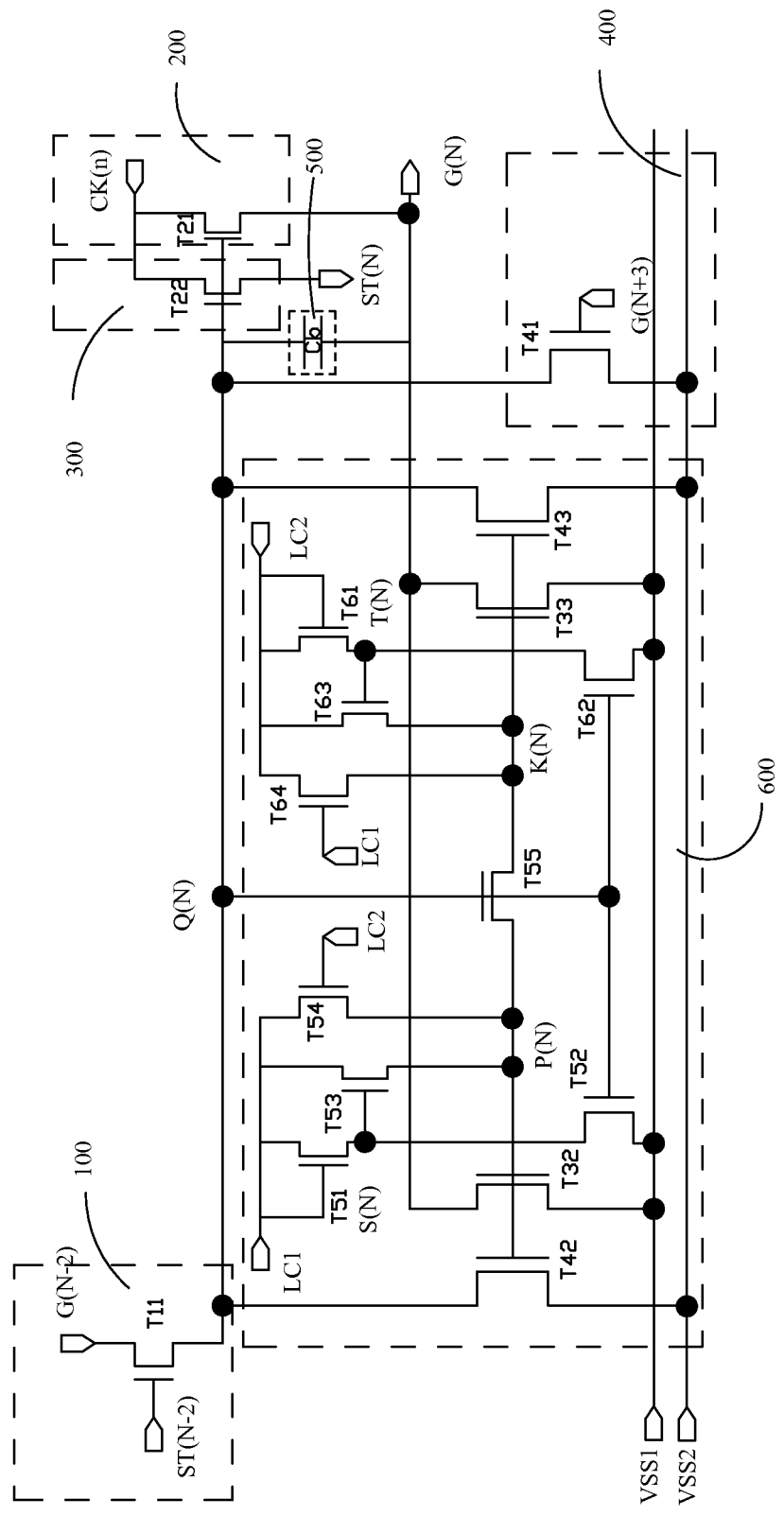
FIG. 8 is a circuit diagram of a gate-drive-on-array circuit according to a second embodiment of the present invention for use with oxide semiconductor thin-film transistors.

Referring to FIG. 8, a circuit diagram of a gate-drive-on-array circuit for use with oxide semiconductor thin-film transistors according to a second embodiment of the present invention is shown. The second embodiment is different from the first embodiment in that the source terminal of the forty-first transistor T41 of the down-pull portion 400 is directly connected to the second constant-voltage negative potential source VSS2 for down pulling the potential of the first node Q(N) to the second constant-voltage negative potential source VSS2 in a non-operating period in order to ensure Vgs<0V for the twenty-first transistor T21; otherwise the components of FIG. 8 that bear the same reference numerals as those of FIG. 2 have the same connection relationship, functionality, and operation principle so that repeated description will be omitted here.

Figure 9:
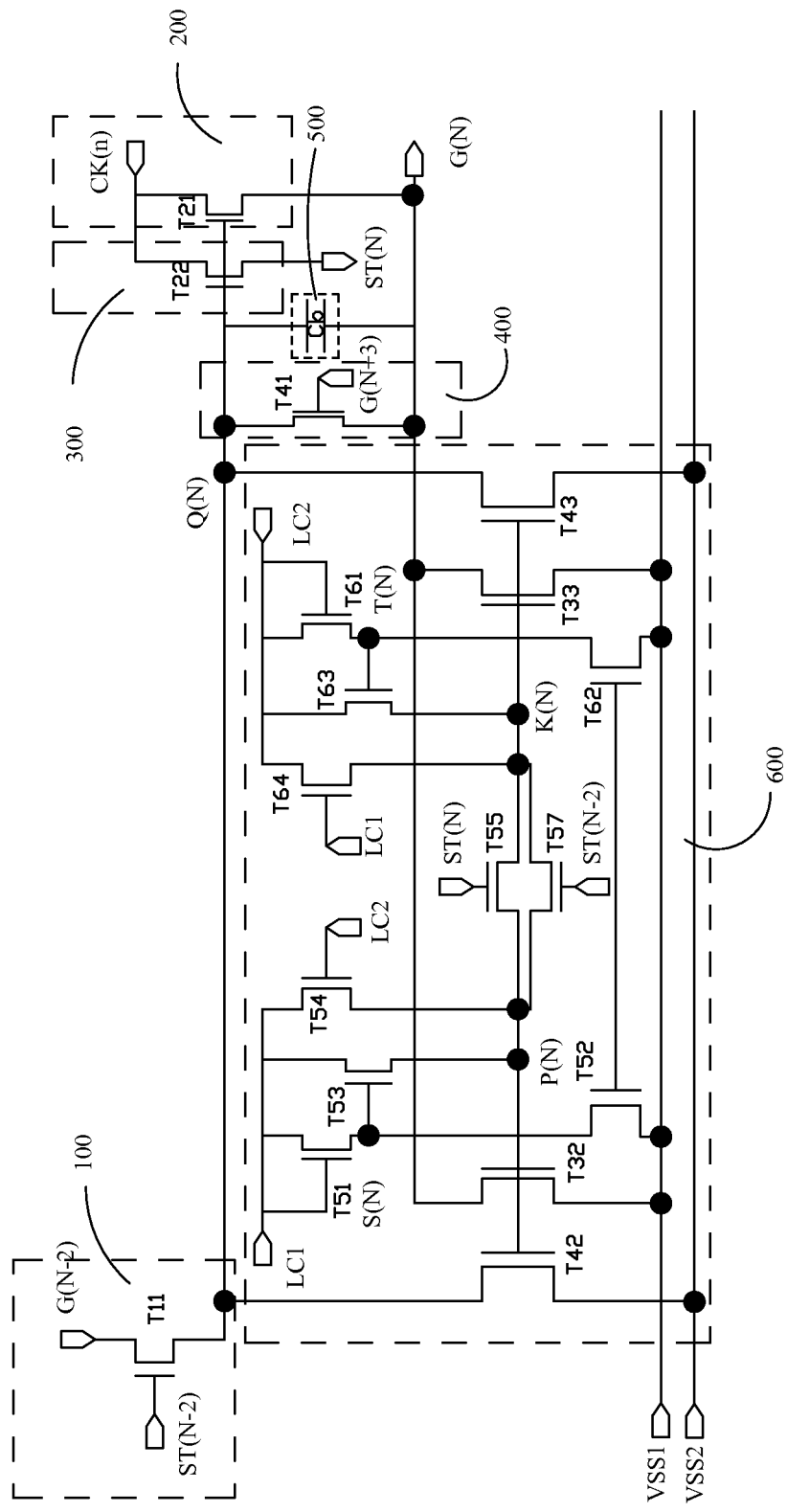
FIG. 9 is a circuit diagram of a gate-drive-on-array circuit according to a third embodiment of the present invention for use with oxide semiconductor thin-film transistors.

Referring to FIG. 9, a circuit diagram of a gate-drive-on-array circuit for use with oxide semiconductor thin-film transistors according to a third embodiment of the present invention is shown. The third embodiment is different from the first embodiment in that the gate terminal of the fifty-fifth transistor of the down-pull holding portion 600 is electrically connected with the drive output terminal ST(N) and the down-pull holding portion 600 further comprises a fifty-seventh transistor T57, where the fifty-seventh transistor T57 has a gate terminal electrically connected with a drive output terminal ST(N−2) of a second-anterior-stage GOA unit of the Nth-stage GOA unit, the (N−2)th-stage GOA unit, a source terminal electrically connected with the second node P(N), and a drain terminal electrically connected with the third node K(N); otherwise, the components of FIG. 9 that bear the same reference numerals as those of FIG. 2 have the same connection relationship, functionality, and operation principle so that repeated description will be omitted here.

Figure 2:
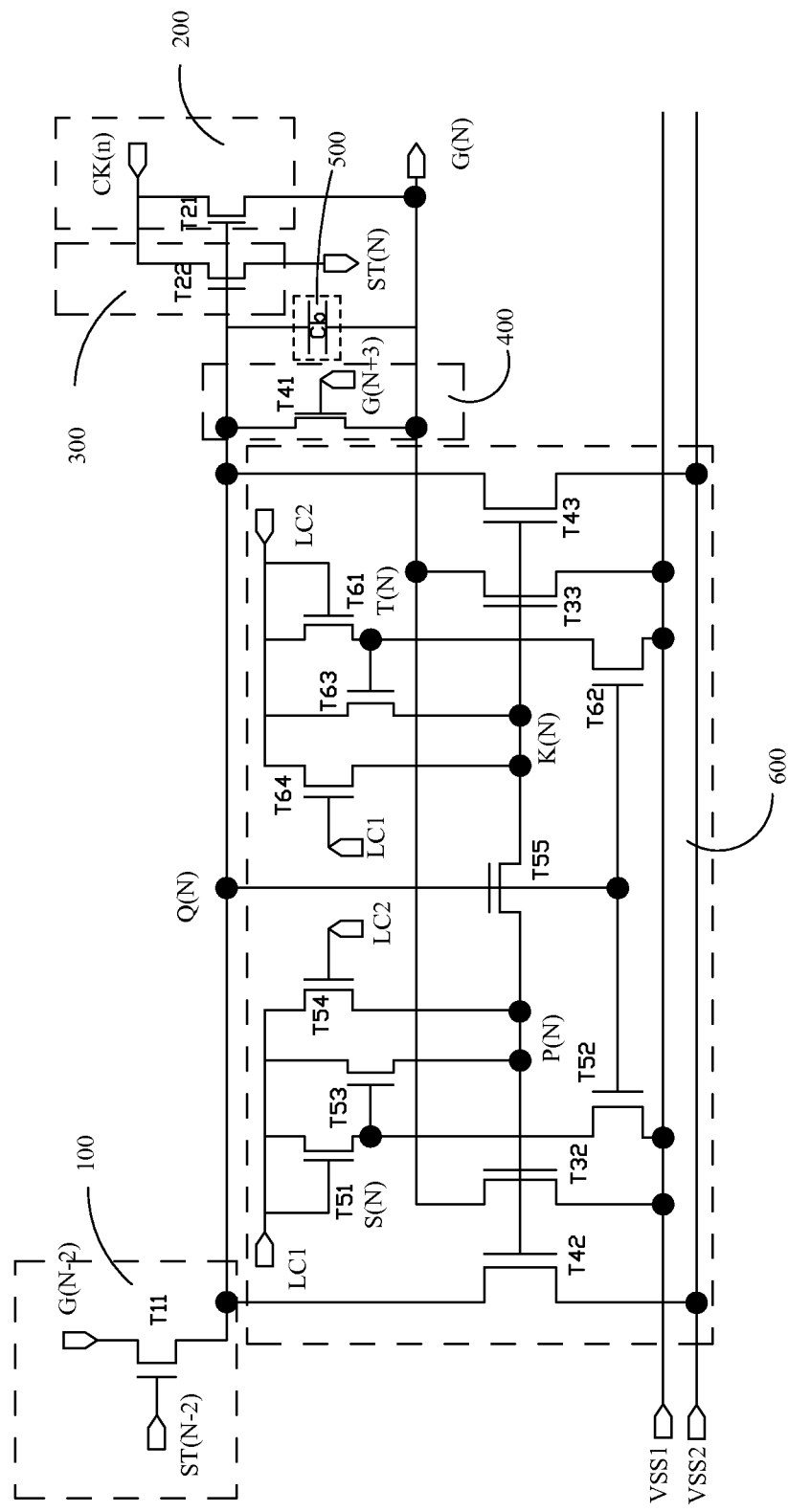
FIG. 2 is a circuit diagram of a gate-drive-on-array circuit according to a first embodiment of the present invention for use with oxide semiconductor thin-film transistors.

The third embodiment is made for improvement in respect of the down-pull holding circuit portion 600 based on the circuit of the first embodiment illustrated in FIG. 2. Since the potential of the first node Q(N) is greatly affected by parasitic capacitances of the twenty-first transistor T21 and the twenty-second transistor T22 in a non-operating period, this makes the potentials of the second node P(N) and the third node K(N) fluctuate therewith. The third embodiment is structured such that the bridge transistor controlled by the first node Q(N) in the first embodiment, namely the fifty-fifth transistor T55, is changed to two bridge transistors that are respectively controlled by the drive output terminal ST(N−2) of the second-anterior-stage GOA unit of the Nth-stage GOA unit, the (N−2)th-stage GOA unit, and the drive output terminal ST(N), namely the fifty-seventh transistor T57 and the fifty-fifth transistor T55. This helps to effectively prevent the influence of the first node Q(N) on the potentials of the second node P(N) and the third node K(N).

Figure 10:
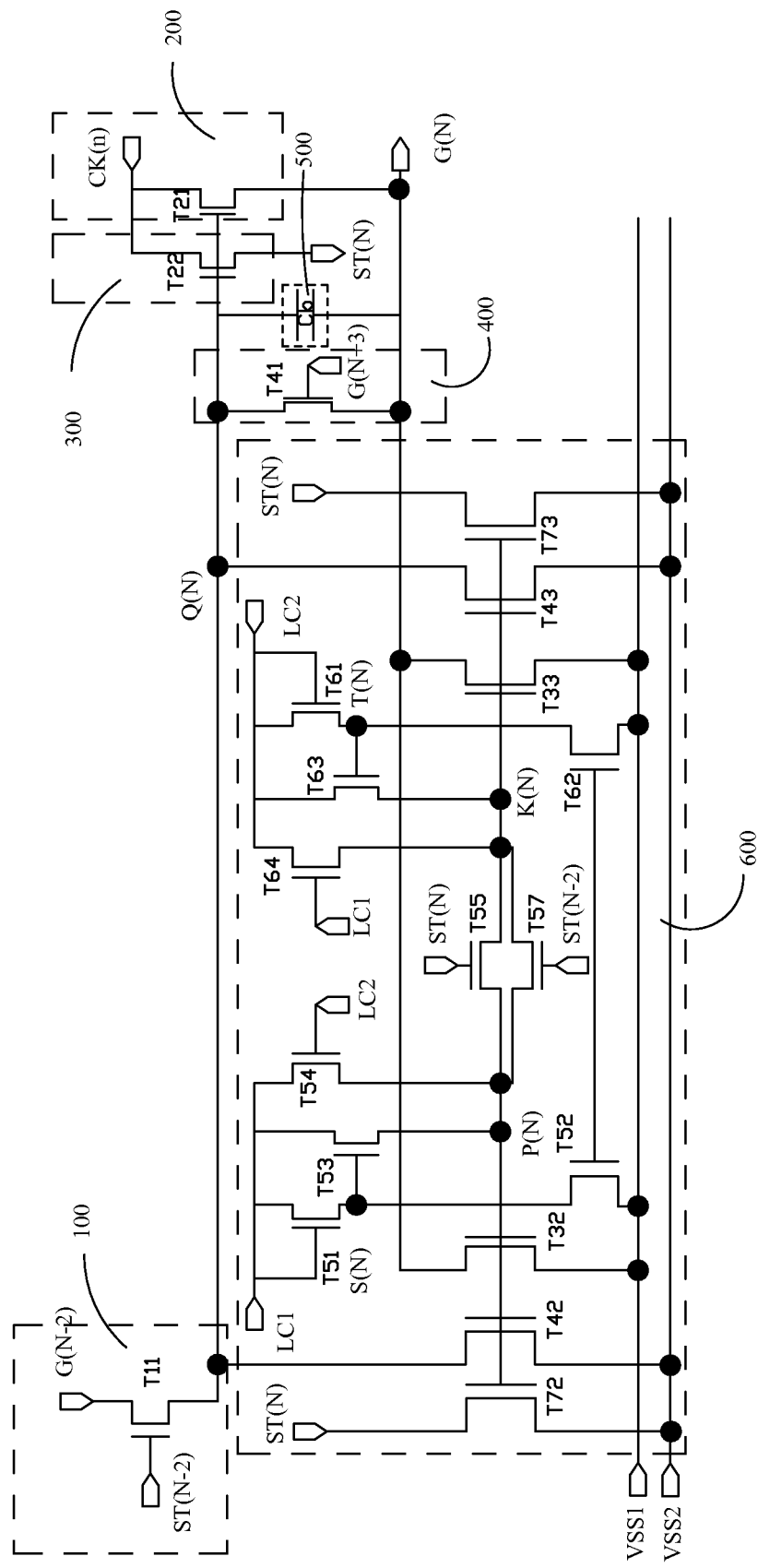
FIG. 10 is a circuit diagram of a gate-drive-on-array circuit according to a fourth embodiment of the present invention for use with oxide semiconductor thin-film transistors.

Referring to FIG. 10, a circuit diagram of a fourth embodiment of the present invention is shown. The components of FIG. 10 that bear the same reference numerals as those of FIG. 9 have the same connection relationship, functionality, and operation principle so that repeated description will be omitted here. The fourth embodiment is different from the third embodiment in that the down-pull holding portion 600 further comprises a seventy-third transistor T73, where the seventy-third transistor T73 has a gate terminal electrically connected with the third node K(N), a source terminal electrically connected with the drive output terminal ST(N), and a drain terminal electrically connected with the second constant-voltage negative potential source VSS2 and further comprises a seventy-second transistor T72, where the seventy-second transistor has a gate terminal electrically connected with the second node P(N), a source terminal electrically connected with the drive output terminal ST(N), and a drain terminal electrically connected with the second constant-voltage negative potential source VSS2.

The fourth embodiment is generally an improvement made on the third embodiment. The fourth embodiment adds, to the third embodiment, the seventy-third transistor T73 and the seventy-second transistor T72. The seventy-third transistor T73 and the seventy-second transistor T72 function to handle the potential of the drive output terminal ST(N) so as to ensure ST(N) is maintained at a stable low potential during a non-operating period thereby reducing the fluctuations of P(N) and K(N).

Figure 11:
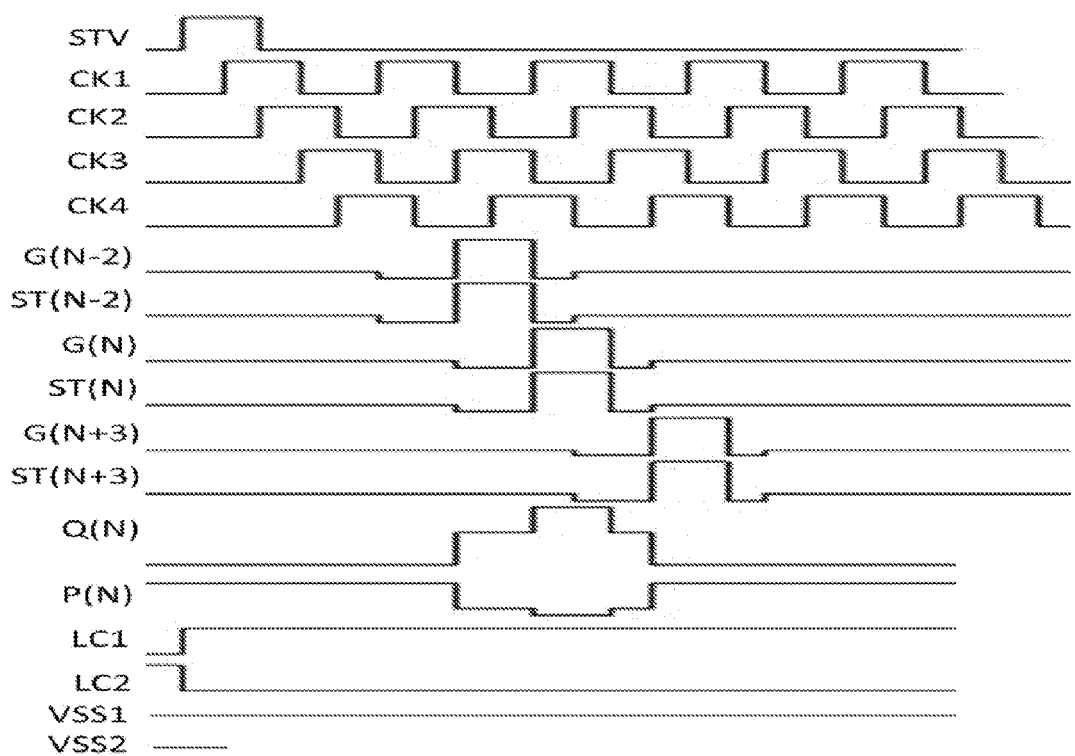
FIG. 11 are waveforms of input and output of each nodal point of the circuits illustrated in FIG. 2 or FIG. 8.

Referring to FIG. 11, waveforms of inputs and outputs of the nodes of the first embodiment or the second embodiment of the present invention are shown, wherein STV signal is the start signal of the GOA circuit; CK1-4 are high-frequency clock signals that drive the GOA circuit; LC1 and LC2 are two low-frequency clock signal sources having opposite phases; and VSS1 and VSS2 are two sets of constant-voltage negative potential source of which the potential is reduced step by step. It can be seen from FIG. 11 that during a non-operating period, the up-pull circuit portion 200 is set in a well-closed condition and the first node Q(N) and the output terminal G(N) supply output normally without generating signal distortion.

In summary, the present invention provides. a gate-drive-on-array circuit for use with oxide semiconductor thin-film transistors, which uses two constant-voltage negative potential sources that are reduced step by step and low potentials of a high-frequency clock signal and a low-frequency clock signal to ensure an up-pull circuit portion is maintained in a well closed condition during a non-operating period without being affected by the high-frequency clock signal so as to ensure the circuit operates normally. Further, the first down-pull circuit portion is re-designed to prevent influence thereof imposed on the outputs of the first node and the output terminal during an operating period so as to ensure the first node and the output terminal can supply the outputs normally without generating signal distortion.

The present invention has been disclosed above with reference to the preferred embodiment; however, the preferred embodiment is not provided to limit the scope of the present invention. Those having ordinary skills of the art may contemplate various changes and modifications without departing from the spirits and scope. Thus, the protection scope of the present invention is only defined by the appended claims.

What is claimed is:

1. A gate-drive-on-array (GOA) circuit for use with oxide semiconductor thin-film transistors, comprising multiple stages of cascaded GOA units, wherein, with N being a positive integer, the Nth-stage GOA unit comprises an up-pull control portion, an up-pull portion, a down-transfer portion, a first down-pull portion, a bootstrap capacitor portion, and a down-pull holding circuit portion;

the up-pull control portion comprising an eleventh transistor, where the eleventh transistor has a gate terminal electrically connected with a drive signal terminal of a second-anterior-stage GOA unit of the Nth-stage GOA unit, the (N−2)th-stage GOA unit, a source terminal electrically connected with an output terminal of the second-anterior-stage GOA unit of the Nth-stage GOA unit, the (N−2)th-stage GOA unit, and a drain terminal electrically connected with a first node;

the up-pull portion comprising a twenty-first transistor, where the twenty-first transistor has a gate terminal electrically connected with the first node, a source terminal electrically connected with a high-frequency clock signal, and a drain terminal electrically connected with an output terminal;

the down-transfer portion comprising a twenty-second transistor, where the twenty-second transistor has a gate terminal electrically connected with the first node, a source terminal electrically connected with the high-frequency clock signal, and a drain terminal electrically connected with a drive output terminal;

the first down-pull portion comprising a forty-first transistor, where the forty-first transistor has a gate terminal electrically connected with an output terminal of a third-posterior-stage GOA unit of the Nth-stage GOA unit, the (N+3)th-stage GOA unit, a drain terminal electrically connected with the first node, and a source terminal electrically connected with the output terminal;

the bootstrap capacitor portion comprising a capacitor, where the capacitor has an end electrically connected with the first node and an opposite end electrically connected with the output terminal;

the down-pull holding portion comprising: a forty-second transistor, where the forty-second transistor has a gate terminal electrically connected with a second node, a source terminal electrically connected with the first node, and a drain terminal electrically connected with a second constant-voltage negative potential source;

a thirty-second transistor, where the thirty-second transistor has a gate terminal electrically connected with the second node, a source terminal electrically connected with the output terminal, and a drain terminal electrically connected with a first constant-voltage negative potential source;

a fifty-first transistor, where the fifty-first transistor has a gate terminal and a source terminal both of which are electrically connected with a first low-frequency signal source and a drain terminal electrically connected with a fourth node;

a fifty-second transistor, where the fifty-second transistor has a gate terminal electrically connected with the first node, a source terminal electrically connected with the fourth node, and a drain terminal electrically connected with the first constant-voltage negative potential source;

a fifty-third transistor, where the fifty-third transistor has a gate terminal electrically connected with the fourth node, a source terminal electrically connected with the first low-frequency signal source, and a drain terminal electrically connected with the second node;

a fifty-fourth transistor, where the fifty-fourth transistor has a gate terminal electrically connected with a second low-frequency signal source, a source terminal electrically connected with the first low-frequency signal source, and a drain terminal electrically connected with the second node;

a fifty-fifth transistor, where the fifty-fifth transistor has a gate terminal electrically connected with the first node, a source terminal electrically connected with the second node, and a drain terminal electrically connected with a third node;

a sixty-fourth transistor, where the sixty-fourth transistor has a gate terminal electrically connected with the first low-frequency signal source, a source terminal electrically connected with the second low-frequency signal source, and a drain terminal electrically connected with the third node;

a sixty-third transistor, where the sixty-third transistor has a gate terminal electrically connected with a fifth node, a source terminal electrically connected with the second low-frequency signal source, and a drain terminal electrically connected with the third node;

a sixty-second transistor, where the sixty-second transistor has a gate terminal electrically connected with the first node, a source terminal electrically connected with the fifth node, and a drain terminal electrically connected with the first constant-voltage negative potential source;

a sixty-first transistor, where the sixty-first transistor has a gate terminal and a source terminal both of which are electrically connected with the second low-frequency signal source and a drain terminal electrically connected with the fifth node;

a thirty-third transistor, where the thirty-third transistor has a gate terminal electrically connected with the third node, a source terminal electrically connected with the output terminal, and a drain terminal electrically connected with the first constant-voltage negative potential source; and a forty-third transistor, where the forty-third transistor has a gate terminal electrically connected with the third node, a source terminal electrically connected with the first node, and a drain terminal electrically connected with the second constant-voltage negative potential source; and the first constant-voltage negative potential source being higher than the second constant-voltage negative potential source.

2. The gate-drive-on-array circuit for use with oxide semiconductor thin-film transistors as claimed in claim 1, wherein in the first-stage GOA unit of the gate-drive-on-array circuit, the gate terminal of the eleventh transistor is electrically connected with a start signal terminal and the source terminal is electrically connected with the start signal terminal.

3. The gate-drive-on-array circuit for use with oxide semiconductor thin-film transistors as claimed in claim 1, wherein in the second-stage GOA unit of the gate-drive-on-array circuit, the gate terminal and the source terminal of the eleventh transistor are both electrically connected with the start signal terminal of the circuit.

4. The gate-drive-on-array circuit for use with oxide semiconductor thin-film transistors as claimed in claim 1, wherein in the third last stage, the second last stage, and the last stage GOA units of the gate-drive-on-array circuit, the gate terminal of the forty-first transistor is electrically connected with the start signal terminal.

5. The gate-drive-on-array circuit for use with oxide semiconductor thin-film transistors as claimed in claim 1, wherein the source terminal of the forty-first transistor of the first down-pull portion is electrically connected with the second constant-voltage negative potential source.

6. The gate-drive-on-array circuit for use with oxide semiconductor thin-film transistors as claimed in claim 1, wherein the gate terminal of the fifty-fifth transistor of the down-pull holding portion is electrically connected with the drive output terminal; the down-pull holding portion further comprises a fifty-seventh transistor, where the fifty-seventh transistor has a gate terminal electrically connected with a drive output terminal of a second-anterior-stage GOA unit of the Nth-stage GOA unit, the (N−2)th-stage GOA unit, a source terminal electrically connected with the second node, and a drain terminal electrically connected with the third node.

7. The gate-drive-on-array circuit for use with oxide semiconductor thin-film transistors as claimed in claim 6, wherein the down-pull holding portion further comprises a seventy-second transistor, where the seventy-second transistor has a gate terminal electrically connected with the second node, a source terminal electrically connected with the drive output terminal, and a drain terminal electrically connected with the second constant-voltage negative potential source; and a seventy-third transistor, where the seventy-third transistor has a gate terminal electrically connected with the third node, a source terminal electrically connected with the drive output terminal, and a drain terminal electrically connected with the second constant-voltage negative potential source.

8. The gate-drive-on-array circuit for use with oxide semiconductor thin-film transistors as claimed in claim 1, wherein the first low-frequency signal source and the second low-frequency signal source are two low-frequency clock signal sources having opposite phases.

9. The gate-drive-on-array circuit for use with oxide semiconductor thin-film transistors as claimed in claim 8, wherein low potentials of the high-frequency clock signal, the first low-frequency signal source, and the second low-frequency signal source are less than the second constant-voltage negative potential source.

10. The gate-drive-on-array circuit for use with oxide semiconductor thin-film transistors as claimed in claim 1, wherein the gate-drive-on-array circuit for use with oxide semiconductor thin-film transistors is a gate-drive-on-array circuit for indium gallium zinc oxide (IGZO) thin-film transistors.

11. A gate-drive-on-array (GOA) circuit for use with oxide semiconductor thin-film transistors, comprising multiple stages of cascaded GOA units, wherein, with N being a positive integer, the Nth-stage GOA unit comprises an up-pull control portion, an up-pull portion, a down-transfer portion, a first down-pull portion, a bootstrap capacitor portion, and a down-pull holding circuit portion;

the up-pull control portion comprising an eleventh transistor, where the eleventh transistor has a gate terminal electrically connected with a drive signal terminal of a second-anterior-stage GOA unit of the Nth-stage GOA unit, the (N−2)th-stage GOA unit, a source terminal electrically connected with an output terminal of the second-anterior-stage GOA unit of the Nth-stage GOA unit, the (N−2)th-stage GOA unit, and a drain terminal electrically connected with a first node;

the up-pull portion comprising a twenty-first transistor, where the twenty-first transistor has a gate terminal electrically connected with the first node, a source terminal electrically connected with a high-frequency clock signal, and a drain terminal electrically connected with an output terminal;

the down-transfer portion comprising a twenty-second transistor, where the twenty-second transistor has a gate terminal electrically connected with the first node, a source terminal electrically connected with the high-frequency clock signal, and a drain terminal electrically connected with a drive output terminal;

the first down-pull portion comprising a forty-first transistor, where the forty-first transistor has a gate terminal electrically connected with an output terminal of a third-posterior-stage GOA unit of the Nth-stage GOA unit, the (N+3)th-stage GOA unit, a drain terminal electrically connected with the first node, and a source terminal electrically connected with the output terminal;

the bootstrap capacitor portion comprising a capacitor, where the capacitor has an end electrically connected with the first node and an opposite end electrically connected with the output terminal;

the down-pull holding portion comprising: a forty-second transistor, where the forty-second transistor has a gate terminal electrically connected with a second node, a source terminal electrically connected with the first node, and a drain terminal electrically connected with a second constant-voltage negative potential source;

a thirty-second transistor, where the thirty-second transistor has a gate terminal electrically connected with the second node, a source terminal electrically connected with the output terminal, and a drain terminal electrically connected with a first constant-voltage negative potential source;

a fifty-first transistor, where the fifty-first transistor has a gate terminal and a source terminal both of which are electrically connected with a first low-frequency signal source and a drain terminal electrically connected with a fourth node;

a fifty-second transistor, where the fifty-second transistor has a gate terminal electrically connected with the first node, a source terminal electrically connected with the fourth node, and a drain terminal electrically connected with the first constant-voltage negative potential source;

a fifty-third transistor, where the fifty-third transistor has a gate terminal electrically connected with the fourth node, a source terminal electrically connected with the first low-frequency signal source, and a drain terminal electrically connected with the second node;

a fifty-fourth transistor, where the fifty-fourth transistor has a gate terminal electrically connected with a second low-frequency signal source, a source terminal electrically connected with the first low-frequency signal source, and a drain terminal electrically connected with the second node;

a fifty-fifth transistor, where the fifty-fifth transistor has a gate terminal electrically connected with the first node, a source terminal electrically connected with the second node, and a drain terminal electrically connected with a third node;

a sixty-fourth transistor, where the sixty-fourth transistor has a gate terminal electrically connected with the first low-frequency signal source, a source terminal electrically connected with the second low-frequency signal source, and a drain terminal electrically connected with the third node;

a sixty-third transistor, where the sixty-third transistor has a gate terminal electrically connected with a fifth node, a source terminal electrically connected with the second low-frequency signal source, and a drain terminal electrically connected with the third node;

a sixty-second transistor, where the sixty-second transistor has a gate terminal electrically connected with the first node, a source terminal electrically connected with the fifth node, and a drain terminal electrically connected with the first constant-voltage negative potential source;

a sixty-first transistor, where the sixty-first transistor has a gate terminal and a source terminal both of which are electrically connected with the second low-frequency signal source and a drain terminal electrically connected with the fifth node;

a thirty-third transistor, where the thirty-third transistor has a gate terminal electrically connected with the third node, a source terminal electrically connected with the output terminal, and a drain terminal electrically connected with the first constant-voltage negative potential source; and a forty-third transistor, where the forty-third transistor has a gate terminal electrically connected with the third node, a source terminal electrically connected with the first node, and a drain terminal electrically connected with the second constant-voltage negative potential source; and the first constant-voltage negative potential source being higher than the second constant-voltage negative potential source;

wherein in the first-stage GOA unit of the gate-drive-on-array circuit, the gate terminal of the eleventh transistor is electrically connected with a start signal terminal and the source terminal is electrically connected with the start signal terminal;

wherein in the second-stage GOA unit of the gate-drive-on-array circuit, the gate terminal and the source terminal of the eleventh transistor are both electrically connected with the start signal terminal of the circuit;

wherein in the third last stage, the second last stage, and the last stage GOA units of the gate-drive-on-array circuit, the gate terminal of the forty-first transistor is electrically connected with the start signal terminal;

wherein the first low-frequency signal source and the second low-frequency signal source are two low-frequency clock signal sources having opposite phases;

wherein low potentials of the high-frequency clock signal, the first low-frequency signal source, and the second low-frequency signal source are less than the second constant-voltage negative potential source; and wherein the gate-drive-on-array circuit for use with oxide semiconductor thin-film transistors is a gate-drive-on-array circuit for indium gallium zinc oxide (IGZO) thin-film transistors.

* * * * *